(12) United States Patent
Acimovic

(10) Patent No.: US 6,982,995 B2
(45) Date of Patent: Jan. 3, 2006

(54) MULTI-CHANNEL SONET/SDH DESYNCHRONIZER

(75) Inventor: Predrag Sava Acimovic, Burnaby (CA)

(73) Assignee: PMC-Sierra, Inc., (CA)

(*) Notice: Subject to any disclaimer, the term of this patent is extended or adjusted under 35 U.S.C. 154(b) by 964 days.

(21) Appl. No.: 09/840,110

(22) Filed: Apr. 24, 2001

(65) Prior Publication Data

US 2002/0021719 A1 Feb. 21, 2002

(30) Foreign Application Priority Data

Apr. 28, 2000 (CA) .................... 2307044

(51) Int. Cl.
*H04J 3/06* (2006.01)
(52) U.S. Cl. .................. 370/518; 370/503; 375/354
(58) Field of Classification Search ........... 370/518, 370/503, 509, 516, 517, 907, 537, 519, 469, 370/470, 203; 375/354, 372, 373, 376
See application file for complete search history.

(56) References Cited

U.S. PATENT DOCUMENTS

| | | | |
|---|---|---|---|
| 5,200,982 A | 4/1993 | Weeber | 375/372 |
| 5,402,452 A | 3/1995 | Powell et al. | 375/372 |
| 5,404,380 A | 4/1995 | Powell et al. | 375/363 |
| 5,497,405 A | 3/1996 | Elliott et al. | 375/372 |
| 5,528,530 A | 6/1996 | Powell et al. | 708/490 |
| 5,617,453 A * | 4/1997 | Roobrouck | 375/367 |
| 5,835,543 A | 11/1998 | Mazzurco et al. | 375/372 |
| 6,088,413 A * | 7/2000 | Autry et al. | 375/372 |
| 6,577,693 B1 * | 6/2003 | Wolf | 375/372 |

* cited by examiner

*Primary Examiner*—Brian Nguyen
(74) *Attorney, Agent, or Firm*—Hall, Myers, Vande, Sande & Pequignot

(57) ABSTRACT

A desynchronizer for desynchronizing one or multiple channels of SONET/SDH data signals, which includes a first in first out (FIFO) buffer having an input coupled to said data signals and an output for outputting asynchronous data obtained from one or more of said SONET/SDH data channels. An arithmetic unit coupled to the FIFO performs all operations required for single or multi-channel desynchronization. An endless phase modulator is coupled to the arithmetic unit and to the FIFO and is operative, in response to input from the arithmetic unit, to produce a single output desynchronized clock or multiple output desynchronized clocks.

17 Claims, 16 Drawing Sheets

Memory Map of RAM#1 for desynchronizing 12 channels of DS3 signal dropped from OC-12 signal Memory Map of RAM#2 for desynchronizing 12 channels of DS3 signal dropped from OC-12 signal

| |
|---|
| Ch#1 FIFO Address Difference |
| Ch#2 FIFO Address Difference |
| Ch#3 FIFO Address Difference |
| Ch#4 FIFO Address Difference |
| Ch#5 FIFO Address Difference |
| Ch#6 FIFO Address Difference |
| Ch#7 FIFO Address Difference |
| Ch#8 FIFO Address Difference |
| Ch#9 FIFO Address Difference |
| Ch#10 FIFO Address Difference |
| Ch#11 FIFO Address Difference |
| Ch#12 FIFO Address Difference |
| 0 |
| 8 |
| 1/64 of UI Phase Increment |
| 1/64 |

| |
|---|
| Ch#1 Accumulated FIFO Address Difference |
| Ch#2 Accumulated FIFO Address Difference |
| Ch#3 Accumulated FIFO Address Difference |
| Ch#4 Accumulated FIFO Address Difference |
| Ch#5 Accumulated FIFO Address Difference |
| Ch#6 Accumulated FIFO Address Difference |
| Ch#7 Accumulated FIFO Address Difference |
| Ch#8 Accumulated FIFO Address Difference |
| Ch#9 Accumulated FIFO Address Difference |
| Ch#10 Accumulated FIFO Address Difference |
| Ch#11 Accumulated FIFO Address Difference |
| Ch#12 Accumulated FIFO Address Difference |
| Ch#1 Pointer Adjustment Bits # |
| Ch#2 Pointer Adjustment Bits # |
| Ch#3 Pointer Adjustment Bits # |
| Ch#4 Pointer Adjustment Bits # |
| Ch#5 Pointer Adjustment Bits # |
| Ch#6 Pointer Adjustment Bits # |
| Ch#7 Pointer Adjustment Bits # |
| Ch#8 Pointer Adjustment Bits # |
| Ch#9 Pointer Adjustment Bits # |
| Ch#10 Pointer Adjustment Bits # |
| Ch#11 Pointer Adjustment Bits # |
| Ch#12 Pointer Adjustment Bits # |
| Spare Address for Holding Intermediate Values |

NOTE: N can be chosen for specific leak rate. Few more addresses can be added to the Ram#1 address space to enable adaptive bit leak rate!

FIG. 3

Taps to Other Channel Multiplex Circuits and to Calibration Circuit

MULTI-CHANNEL SONET/SDH DESYNCHRONIZER

FIELD

The present invention relates to multi-channel SONET/SDH desynchronizer for reading and transmitting asynchronous data received from several synchronous channels.

BACKGROUND

Data carried over a number of tributaries such as DS1, DS3, E1, E3, etc., each of generally different frequencies, may be multiplexed together so that it can share a common transmitter, receiver and transmission media. In order to transmit such data together, it is mapped onto a frame at the place where it enters the network. All of the signals from the various tributaries are synchronized to a single network clock. Excess bandwidth is filled with stuff bits which carry no information. A pointer adjustment can be used in place of or, in addition to, the stuff bits to indicate changes in the data rate of the synchronous channel and lack of synchronism of the nodes in the network. At the other end of the network a desynchronizer reads and transmits asynchronous data that had been carried over the synchronous channel. Variations in the instantaneous rate of the payload data caused by the interspersing of overhead data and the stuff bits can give rise to payload mapping jitter which can feed through into the desynchronizer output. The pointer adjustment due to lack of synchronism of the nodes in the network gives rise to another form of jitter which is more serious than mapping jitter. One pointer adjustment results in 8 cycles of network clock jitter. The pointer adjustment occurrence is a stochastic process and, as a result, it is difficult to predict its behaviour. Desynchronization is used at the destination of the digital signals to also attenuate the mapping jitter. Mapping jitter is deterministic and easy to filter even with wide bandwidth phase locked loop (PLL) circuits.

Desynchronizers typically include a first in first out buffer (FIFO), a phase detector to measure the FIFO buffer depth, a passive or active analog loop filter to filter the phase detector output, and a voltage controlled oscillator (VCO) to generate an output clock to control data transmission from the FIFO buffer. These elements make up a phase locked loop.

There are some important differences in the way single and multiple channel desynchronizers are designed. The term "multiple channel" means that more than one data signal is being dropped or extracted from the SONET/SDH signal. For example, in the case of the OC-1 signal one can drop 28 DS1 signals, which might need to be desynchronized. In the case of the OC-3 signal one can drop 3 DS3 signals or 84 DS1 signals. In the case of the OC-12 one can drop up to 12 DS3 signals or 336 DS1 signals. With the advance of data communications and the requirement for higher bandwidths, there are more and more instances of multiple channels being dropped from the same SONET/SDH signal.

A multiple channel desynchronizer should not use a voltage-controlled oscillator (VCO) to generate the desynchronized output clock. Most of the known desynchronizers use voltage-controlled crystal oscillators (VCXOs) or VCOs in cases where desynchronizers produce a control voltage that controls the frequency of the VCO. Multiple channels, for example 12 channels of DS3 can be dropped from OC12, can have output frequencies quite close to each other and, as a consequence, mutual coupling can cause excessive jitter.

The reason for the excessive jitter is caused by the large index of modulation of the frequency modulation device. The index of modulation of the frequency modulation device is inversely proportional to the frequency of modulation. Thus, small frequency offsets between desynchronized clocks, if there is even a very small coupling between the desynchronization circuits, would produce through PLL action very low modulation frequencies on the control voltages which would modulate, excessively, the VCO outputs.

The multiple channel desynchronization circuit should use a phase modulation method when generating desynchronized clocks to avoid the excessive jitter caused by mutual coupling of output clocks. The phase modulation device can be implemented as an endless phase modulator, a numerically controlled oscillator (NCO) or a single side-band modulator (SSB). Several patents have already suggested use of the NCO devices for the desynchronization. However, a large number of the NCO devices on the same chip, especially if generating high frequencies, would result in large power consumption. A better way, as far as power consumption is concerned, where an NCO is used to synthesize a low frequency, is to up-convert this low frequency using a mixer and a high frequency local oscillator (LO). The output signal from the mixer is filtered using the LC filter. In an ASIC implementation of the desynchronizer use of the LC filter is not an option. More suited for the ASIC implementation is a version of up-conversion implementation, which uses the SSB modulator. By the careful matching of phases and amplitudes in two branches containing double balanced mixers, the SSB modulator suppresses unwanted products of mixing, the LO leakage and the undesired side-band. Normally, the SSB modulators can suppress the unwanted products by more than 20 dBs, resulting in jitter of less than 0.05 UIpp. The SSB modulation results in intrinsic jitter well below the level allowed by Bellcore GR-253-CORE. Some care has to be taken to avoid excessive mutual coupling of output clocks because they still add to jitter, although there is no excessive problem with low frequency offsets as in the case of the frequency modulation device.

The preferred implementation would use an endless phase modulator, because it is a digital approach and it is robust, due to the fact that coupling between different output signals has the least effect.

The second conclusion from investigating a multiple channel desynchronizer is that a separate desynchronizer for each channel will result in an extremely large circuit size. That is specifically true if each of the necessary steps to be performed are implemented without the re-use of circuitry. None of the prior art discloses the re-use of the circuitry. Accordingly, it is an object of the invention to merge the desynchronization of all channels into a single channel by re-using the desynchronization circuitry.

SUMMARY OF THE INVENTION

According to the invention there is provided a single desynchronizer for desynchronizing a plurality of data channels of data signals by desynchronizing each channel in turn. The desynchronizer has a plurality of first-in first-out buffer (FIFO) blocks, one for each of said data channels. The FIFO blocks each have respective FIFO read and write address outputs and a gapped clock input operative in response to gapped clock signals, to store input data extracted from a SONET/SDH frame. An arithmetic unit has a phase word output and inputs coupled to the read and write address outputs of each of the FIFO blocks, and is operative to calculate an address difference of the read and write addresses for each of the FIFO blocks and a phase locked loop (PLL) phase increment value. The PLL value depends on the address difference. A pointer adjustment phase difference is added or subtracted from the PLL phase increment value to produce a total phase increment from said phase word output for each of said FIFO blocks. An endless phase modulator common control block is coupled to an output of the arithmetic unit and is operative to produce delay tap control signals in response to corresponding total phase increment signals from the arithmetic control unit. An endless phase modulator is coupled to an output of the endless phase modulator common control block and to an oscillator and is operative in response to the delay tap control signals to generate clock signals frequency shifted from the oscillator clock frequency and to apply these clock signals to respective desynchronized clock inputs of said FIFO buffer blocks. In this way desynchronized data signals are clocked out from the FIFO buffer blocks.

The endless phase modulator may include a delay line having delay elements with taps at junctions of the delay elements and a plurality of modulator multiplexers, one for each of the plurality of data channels, coupled to the taps and operative to select a delay tap control signal in response to receipt of a tap select signal.

Preferably, the delay elements are buffers.

An arithmetic unit, which is coupled to the FIFO, performs all operations required for single or multi-channel desynchronization. The endless phase modulator is coupled to the arithmetic unit and to the FIFO and is operative, in response to input from the arithmetic unit, to produce a single output desynchronized clock or multiple output desynchronized clocks.

Several steps are necessary in the desynchronization process. Depending on which algorithm is being used, some steps are optional. A desynchronizer is a form of phase locked loop (PLL). A FIFO is used to store data clocked into the FIFO with a gapped clock, which is a result of extracting a digital signal from a SONET/SDH frame. A narrow-band PLL is used to average this gapped clock with a long time-constant and clock the data out of the FIFO with a non-jittery clock, whose frequency is equal to the average frequency of the gapped clock. Firstly, there is a need to form a difference between the FIFO write and read addresses. Forming a difference requires a subtract circuitry. The width of the subtract circuitry depends on the FIFO size which, on the other hand, depends primarily on the data rate of the channel being desynchronized. This is equivalent to building a phase detector for the PLL operation. This subtract action forms the error signal for the PLL.

The next step is to filter the FIFO write and read address difference to average the in-flux of data into the FIFO and make it even with the out-flux of the data from the FIFO. The previous state of the art uses separate circuitry for filtering whereas the present desynchronization circuit reuses the same add-subtract circuit to detect an error signal for the PLL and also to perform the filtering. A filter with a perfect integrator and a zero in a transfer function centers the FIFO fill level for any steady state type of stimulus. This type of loop filter has a superior performance as compared to the filter without the perfect integrator. Most of the state of the art desynchronizers use the latter kind of loop filter. Next, most desynchronizers use separate circuitry to process the pointer adjustment related bits in the FIFO, in many cases building a separate, very often, adaptive filter for this purpose, whereas the present circuit reuses the same add-subtract circuit to achieve the same effect. In processing the pointer adjustment related bits in the FIFO, the present desynchronizer goes a step further than known desynchronizers because the present one uses a digitally controlled endless phase modulator to perform a semi-open loop modulation of the endless phase modulator. Most known desynchronizers use bit leaking in which they hide the pointer adjustment related bits that are in the FIFO from the PLL. Using some algorithm for filtering, these bits are re-introduced to the PLL. The embodiment of the multi-channel desynchronizer disclosed can easily be changed to perform the same function, but superior performance can be achieved if one uses the semi-open loop modulation of the endless phase modulator. In this case, the undesirable response of the PLL is eliminated when an error signal is introduced, and the pointer adjustment related bits in the FIFO are completely hidden from the PLL. The state of the art desynchronizers that do not use a digitally generated clock can not completely hide the pointer adjustment related bits in the FIFO from the PLL; such desynchronizers do it only temporarily for the incoming bits, but need to re-introduce the incoming bits to the PLL because they do not have enough precision to synthesize the desired clock. Such prior art desynchronizers must depend on the PLL to adjust for any inaccuracy in synthesis. The state of the art desynchronizers, that use a digitally generated clock, can perform arbitrary phase modulation of the generated clock, but only U.S. Pat. No. 5,497,405 issued to Elliot et al. uses this technique. Unfortunately, the method used in Elliot et al. creates unnecessary jitter because it uses only open loop. The present method needs to use, for its reference, a clock identical to the add side system clock. This is not easy to achieve, as even then it produces unnecessary jitter for each stuffing bit. On the other hand, the present embodiment makes it is easy to implement, re-using the same circuitry, the semi-open loop for handling the pointer adjustment related jitter and closed loop for handling bit mapping and network related jitter. Because digital modulation of an endless phase modulator is used, one knows exactly how many bits came to the FIFO due to the pointer adjustment and how many have leaked out by modulating the endless phase modulator in an open loop fashion, so the bits in the FIFO resulting from the pointer adjustment can be hidden from the PLL at all times. The small inaccuracy of this process resulting from the small difference between the line clock used to generate the modulation that leaks the pointer adjustment related bits from the FIFO, and the actual desynchronized clock frequency is taken care by the PLL. However, this inaccuracy has an extremely small error so it does not produce any undesirable response of the PLL.

The present invention includes a novel embodiment of a desynchronizer for single or the multiple data channels dropped from the SONET/SDH signal. It uses compact circuitry capable of processing a number of channels that requires only addition or subtraction circuits, multiplex circuits and RAM. This circuitry is re-used to perform necessary operations for a single channel desynchronizer and as well for a multiple channel desynchronizer.

The circuit consists of a FIFO block or several FIFO blocks for individual data channels. All processing is done in one arithmetic unit block and an output desynchronized clock or clocks, in the case of multi-channel applications, are produced in an endless phase modulator/modulators. Alternatively, one can substitute for the endless phase modulators SSBs (single sideband modulators) or, in case of low frequency data channels (DS1, E1), with digitally controlled programmable modulo dividers.

The same arithmetic unit circuit can be used to execute all operations necessary for a single or multi-channel desynchronizer using a narrow-band second order type two PLL with adjustable loop bandwidth to avoid FIFO spill while simultaneously independently processing and filtering pointer adjustment related bits in FIFO.

The same arithmetic unit circuit can be used to execute all operations necessary for a single or multi-channel desynchronizer using a narrow-band second order type dual PLL with adjustable loop bandwidth to avoid FIFO spill while simultaneously, independently processing adjustment related bits in the FIFO using an open loop method of modulating the endless phase modulator.

The proposed endless modulator block is a novel way to generate multiple clocks at different frequencies using one delay line and one calibration circuit. Novel use of a look-up list (LUT), built using a RAM, that converts the instantaneous phase value to the select signal for each of the multiplexer circuits that generate different clocks, results in a loop bandwidth independent of the number of taps whose delay is equivalent to one clock pulse. Use of a dual port RAM and calibration circuit reduce the size of the LUT. This method results in a PLL loop bandwidth independent of process variation and temperature. Use of the endless phase modulator significantly reduces power consumption and gate count compared to a numerically controlled oscillator (NCO) method.

BRIEF DESCRIPTION OF THE DRAWINGS

Further features and advantages will be apparent from the following detailed description, given by way of example, of a preferred embodiment taken in conjunction with the accompanying drawings, wherein:

FIG. 3 is a schematic diagram of a memory map of arithmetic unit RAM blocks;

DETAILED DESCRIPTION WITH REFERENCE TO THE DRAWINGS

Figure 1:
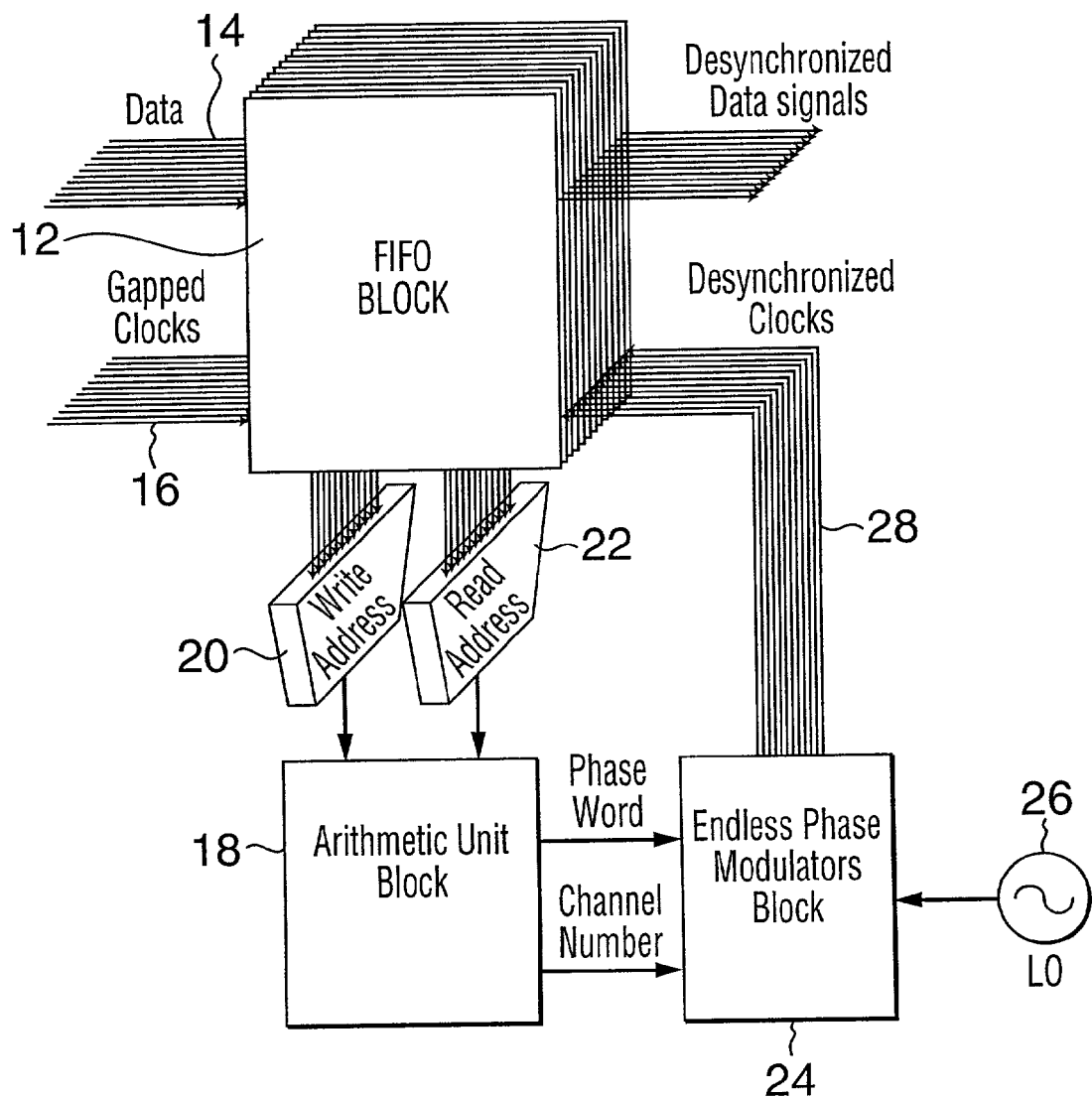
FIG. 1 is a multi-channel desynchronizer.
Figure 13:
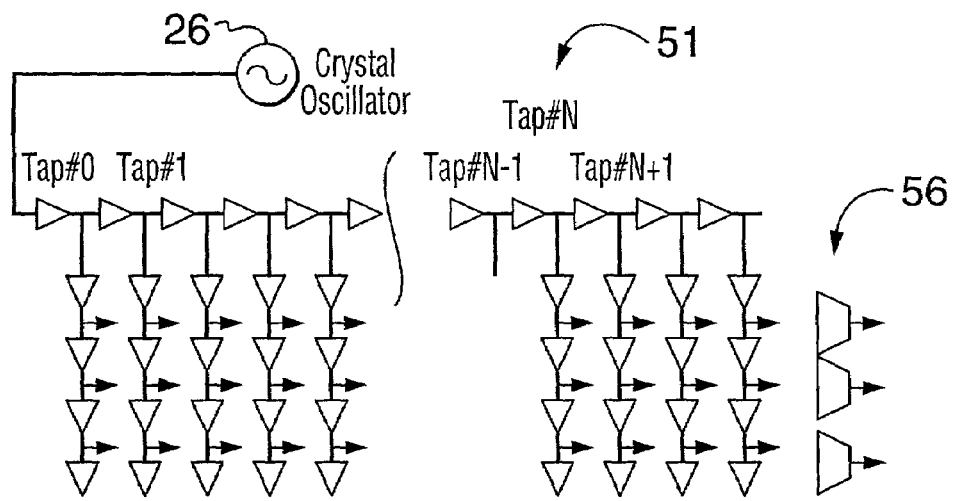
FIG. 13 is an endless phase modulator delay line.

Referring to FIG. 1, the desynchronizer includes a FIFO block 12, which receives synchronized data from a set of SONET/SDH data lines 14 and gapped clock signals on gapped clock lines 16. An arithmetic unit block 18 is coupled to the FIFO block 12 by both a write address block 20 and a read address block 22. An endless phase modulator block 24 couples to the arithmetic unit block 18 and to a crystal oscillator 26. The crystal oscillator 26 oscillates at a nominal data rate of the digital signal which, for example, for desynchronizing DS3 is a rate of 44.736 MHz. The output of this crystal oscillator 26 is used in the endless phase modulator block 24 to generate the desynchronized clocks on desynchronized clock lines 28. A delay line with taps and a multiplex circuit that selects a specific tap generates different output clocks (see FIG. 13). Successive selecting of a higher and higher tap number of the delay line creates a lower frequency clock than the crystal oscillator frequency. Successive selecting of lower and lower tap numbers of the delay line creates a clock of higher frequency than the crystal oscillator frequency.

Figure 2:
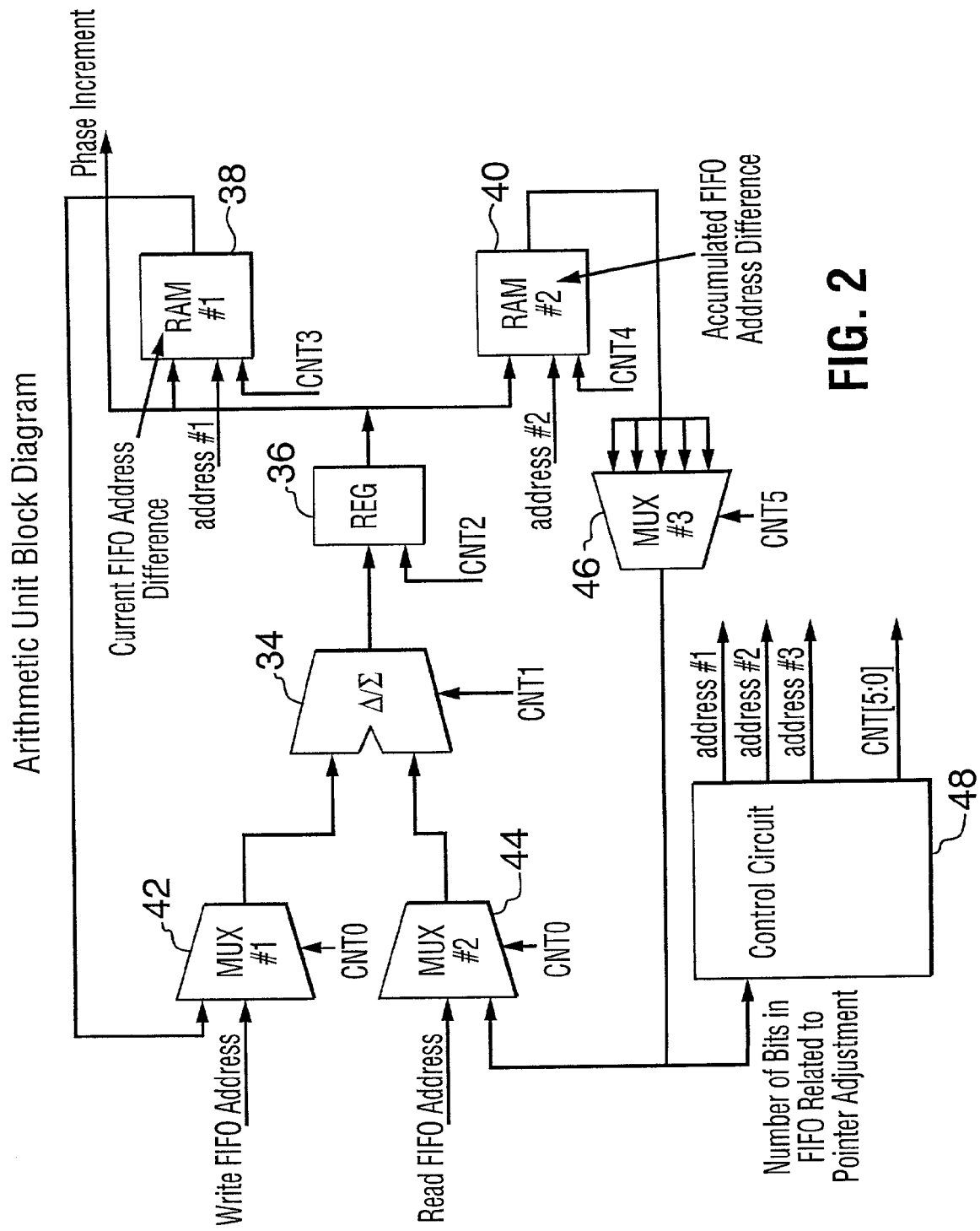
FIG. 2 is a schematic diagram of an arithmetic unit block diagram.

The arithmetic unit (AU) block 18 is common for all the channels and it uses a simple structure that performs a number of different functions. The Block Diagram of the AU is shown in FIG. 2.

The arithmetic unit block 18 consists of one wide add-subtract circuit 34, a register 36 that latches the product of adding or subtracting and preferably two RAM blocks 38 and 40 that hold information used in calculating a phase increment for each channel. The memory map of these two RAM blocks is shown in FIG. 3. It is possible to use one RAM block, but the speed of operation is much faster with two RAM blocks. The first RAM block 38 contains the effective FIFO address difference from which the bits related to the pointer adjustment in the FIFO 12 have been subtracted. This RAM block can also contain constant values used in processing the number of bits in the FIFO 12 due to the pointer adjustments. The second RAM block 40 contains the values of the accumulated effective FIFO address difference, as well as the current number of bits in FIFO 12 that are related to the pointer adjustments. These pointer adjustment related bits in FIFO 12 are slowly disposed of by adding an extra amount of phase increment to calculated phase increments resulting from PLL calculations. This extra phase increment, that leaks pointer adjustment bits from the FIFO 12, is independent of the calculated phase increment for PLL operation and it is added to the PLL phase increment after the PLL calculation. The pointer adjustment bits in the FIFO 12 are handled in such a matter to deny the PLL the knowledge of their existence.

The arithmetic unit block 18 contains three multiplex circuits. Two multiplex circuits, MUX #1 42, and MUX #2 44 are used to provide the add-subtract circuit 34 with the desired input, either the FIFO address for each of the channels or the RAM output. The third multiplex circuit, MUX #3 46, scales the output of the operations, therefore it functions as a fast multiply/divide by 2 m circuit, where m is an integer. An adjustment of the PLL's Open Loop Gain and the Loop Filter transfer function zero positioning can be set using multiplex circuit MUX #3 46.

The control circuit 48 conducts the operation of the arithmetic unit block 18. It is designed as a number of counters (not shown) that step the desynchronizer though the desired phases. A simple change of the counters can be used to change the algorithm used in the desynchronization.

The arithmetic unit block 18 runs synchronously with a 51.84 MHz clock recovered from the lines 16. The SONET/SDH frame row rate is 72 kHz. The FIFO write 20 and read 22 addresses of one of the channels are sampled at the 72 kHz rate and they are processed at this rate. The sampling of the FIFO addresses can be done at slower rate (example 8 kHz), but sampling of the FIFO addresses at the highest possible rate at which reading of FIFO write address 20 results in small mapping jitter, will minimize the aliasing of jitter introduced over the optical line from the higher frequencies into the loop bandwidth.

Figure 4:
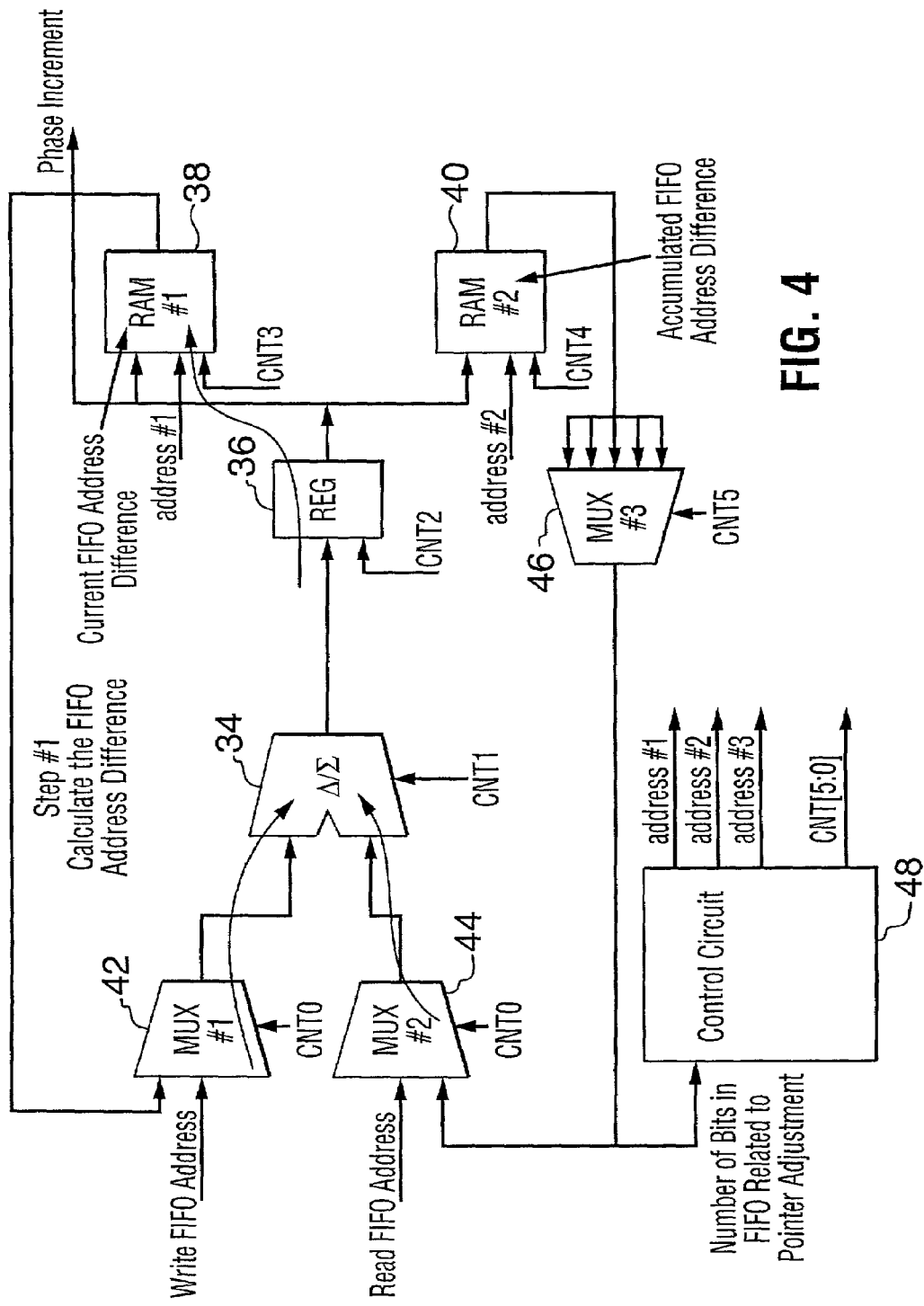
FIGS. 4–11 are schematic diagrams of steps 1–8, respectively, of the arithmetic unit algorithm.

The operations that are required to process one channel are relatively simple and can be sequenced one after other using the same basic circuitry. Operations are:

Subtract read FIFO address from the write FIFO address and store it for further use in RAM #1 38 as shown in FIG. 4.

Figure 5:
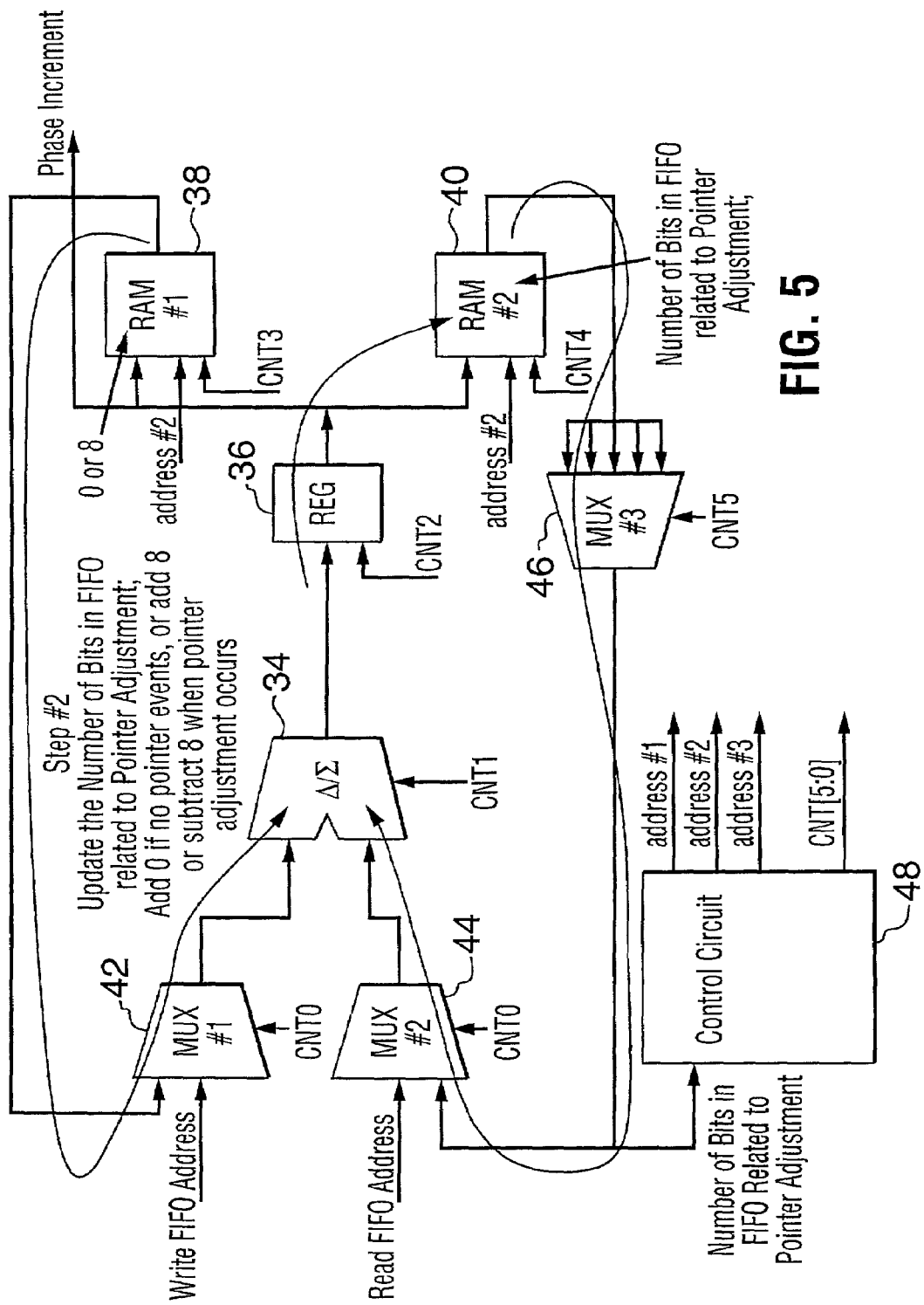

If a pointer adjustment is detected than add or subtract 8 to the number representing the bits in FIFO 12 related to the pointer adjustment, stored in RAM #2 40 for the specific channel being processed, otherwise, if no pointer adjustment is detected, add zero. This is shown in FIG. 5.

Figure 6:
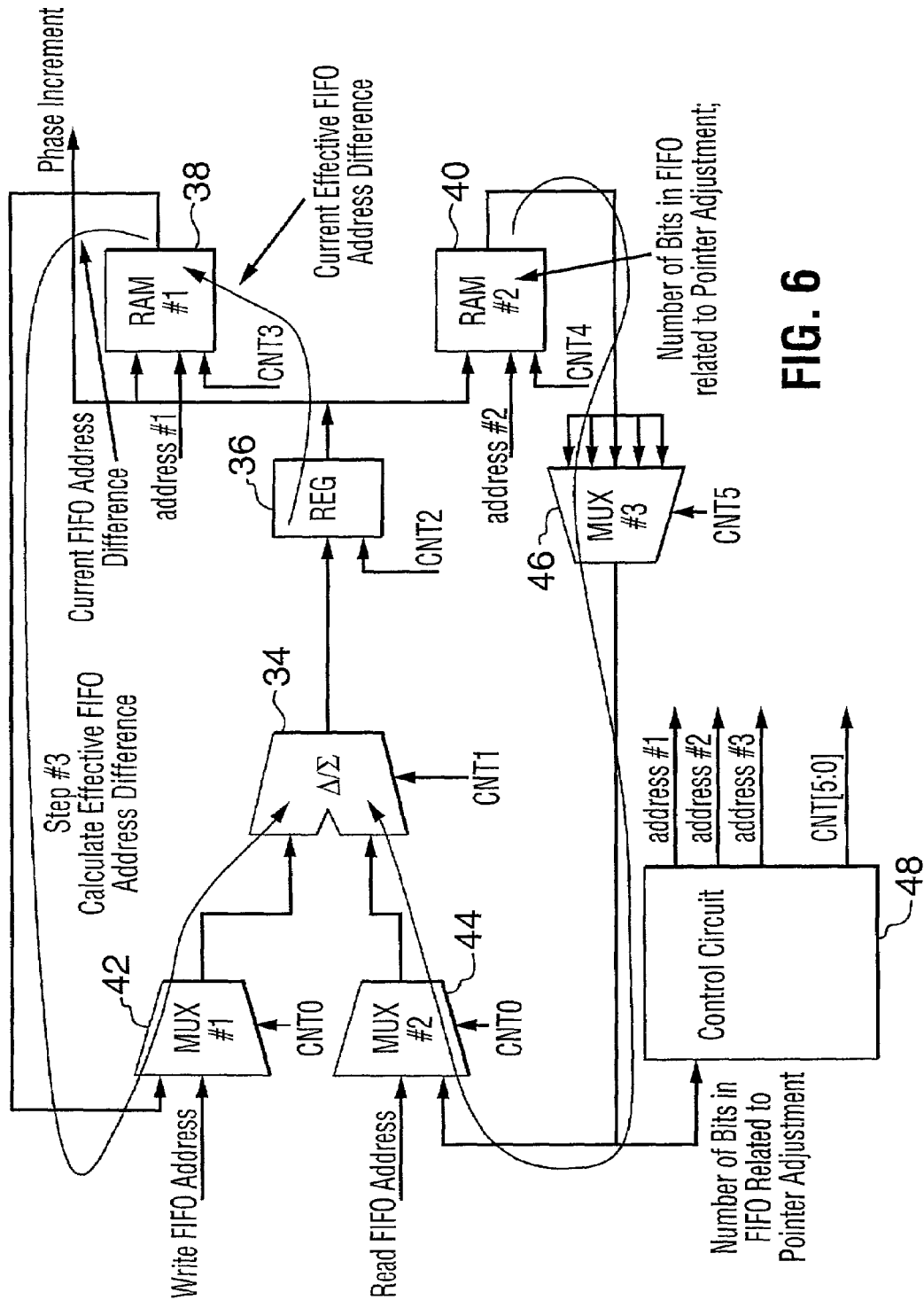

Subtract the current number of bits in FIFO related to the pointer adjustment, content of RAM #2 40, from current FIFO write and read address difference, content of RAM #1 38, creating an effective FIFO address difference, overwriting the current FIFO write and read address difference address in RAM #1 38. This is shown in FIG. 6.

Figure 7:
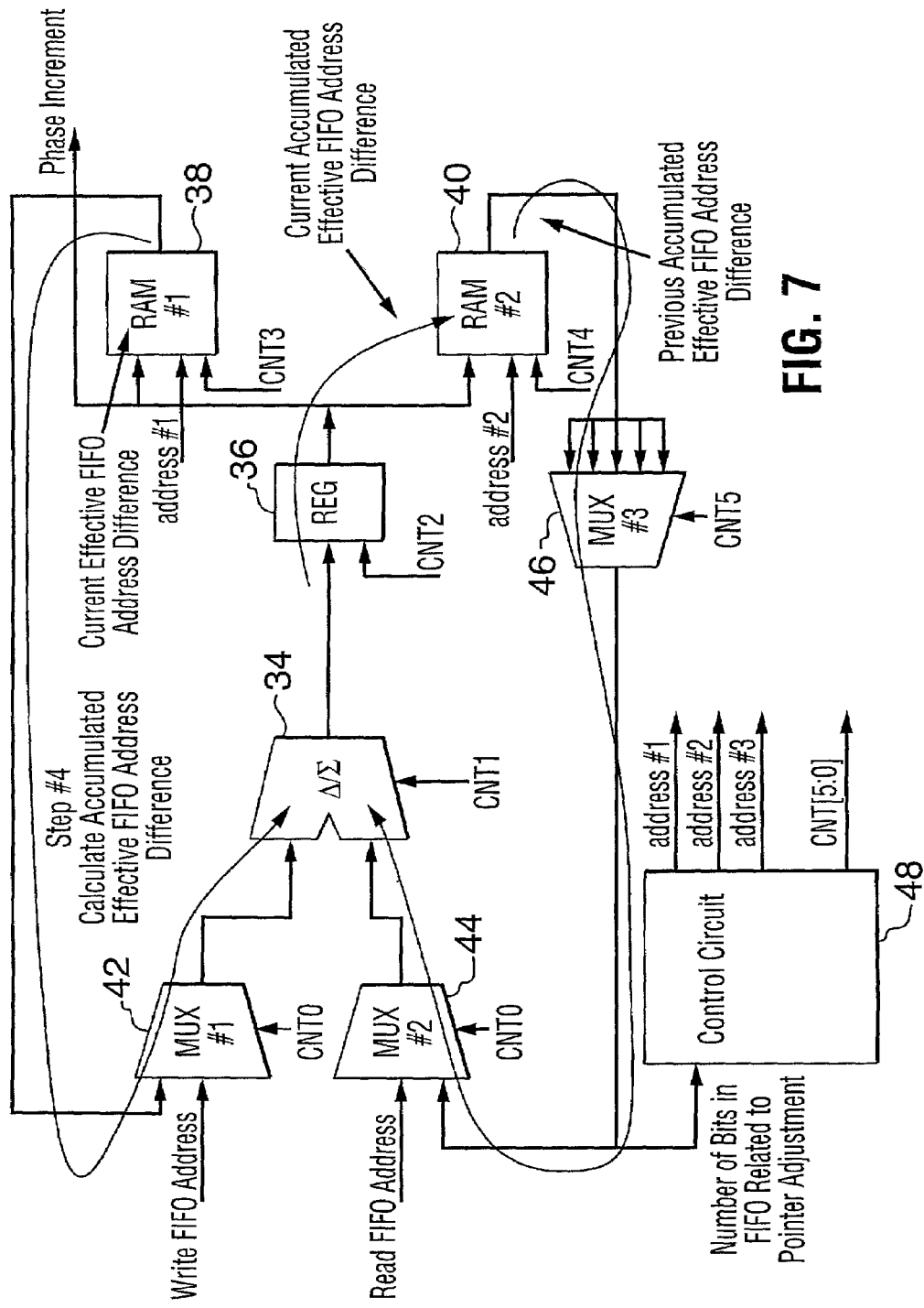

Add the effective FIFO address difference, from RAM #1 38, to the accumulated effective FIFO address difference, stored in RAM #2 40, and after the addition store new value in the RAM #2 40 for further use as shown in FIG. 7.

Figure 8:
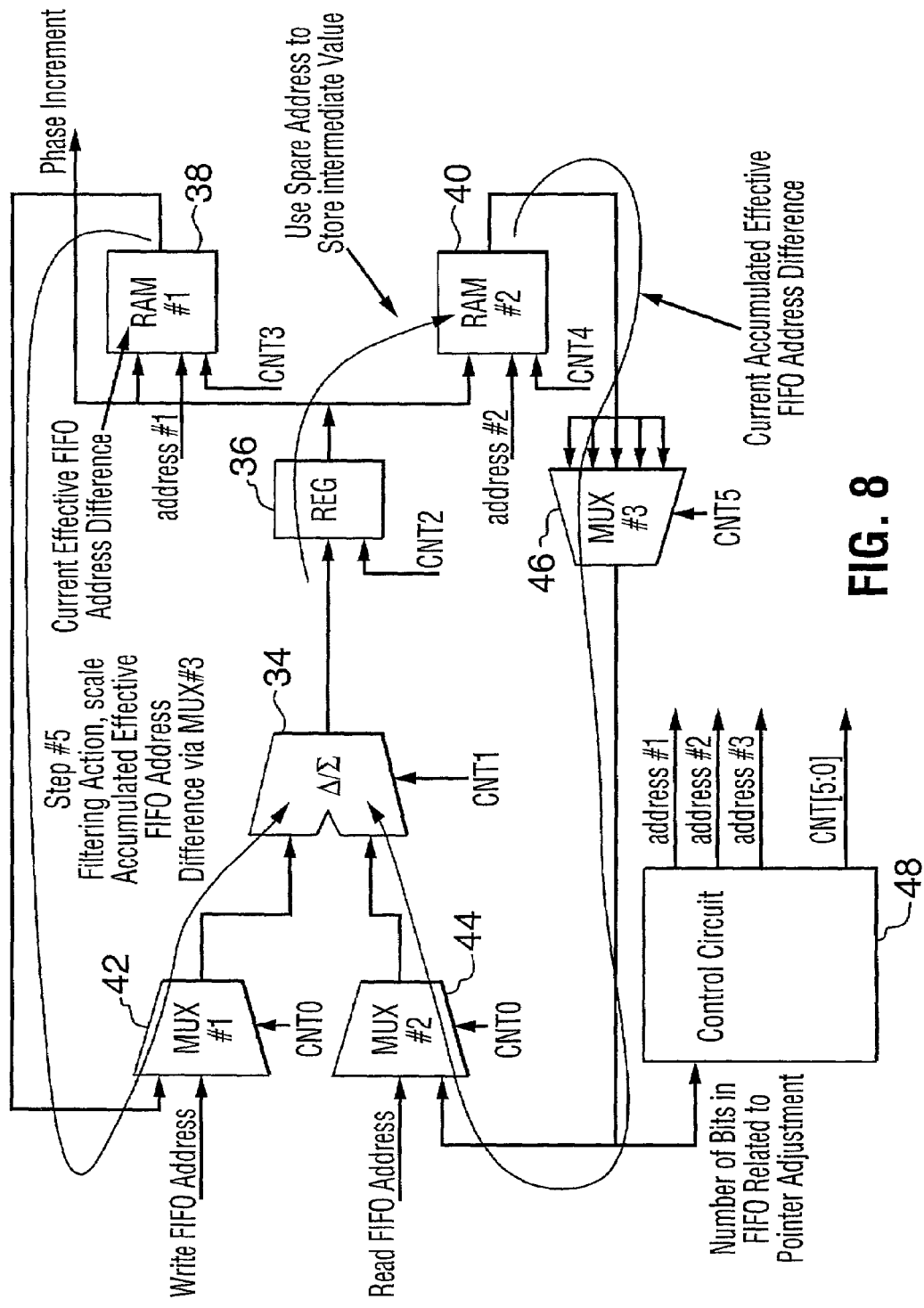

Add the current effective FIFO address difference to the scaled accumulated value of the effective FIFO address difference. The scaling is performed by taking only the most significant bits of the word representing the accumulated effective FIFO address difference. The multiplex circuit, MUX #3 46, is used for the scaling operation. This operation is equivalent to implementation of a loop filter with an ideal integrator and compensation. The ratio of accumulated effective FIFO address difference value versus the current effective FIFO address difference sets the position of the zero in the transfer function of the loop filter. Without any disadvantage to the performance, the ratio can be chosen to be power of 2 so a simple multiplex circuit can accomplish scaling. The result can be stored in the spare address RAM #2 40 location. This is shown in FIG. 8.

Figure 9:
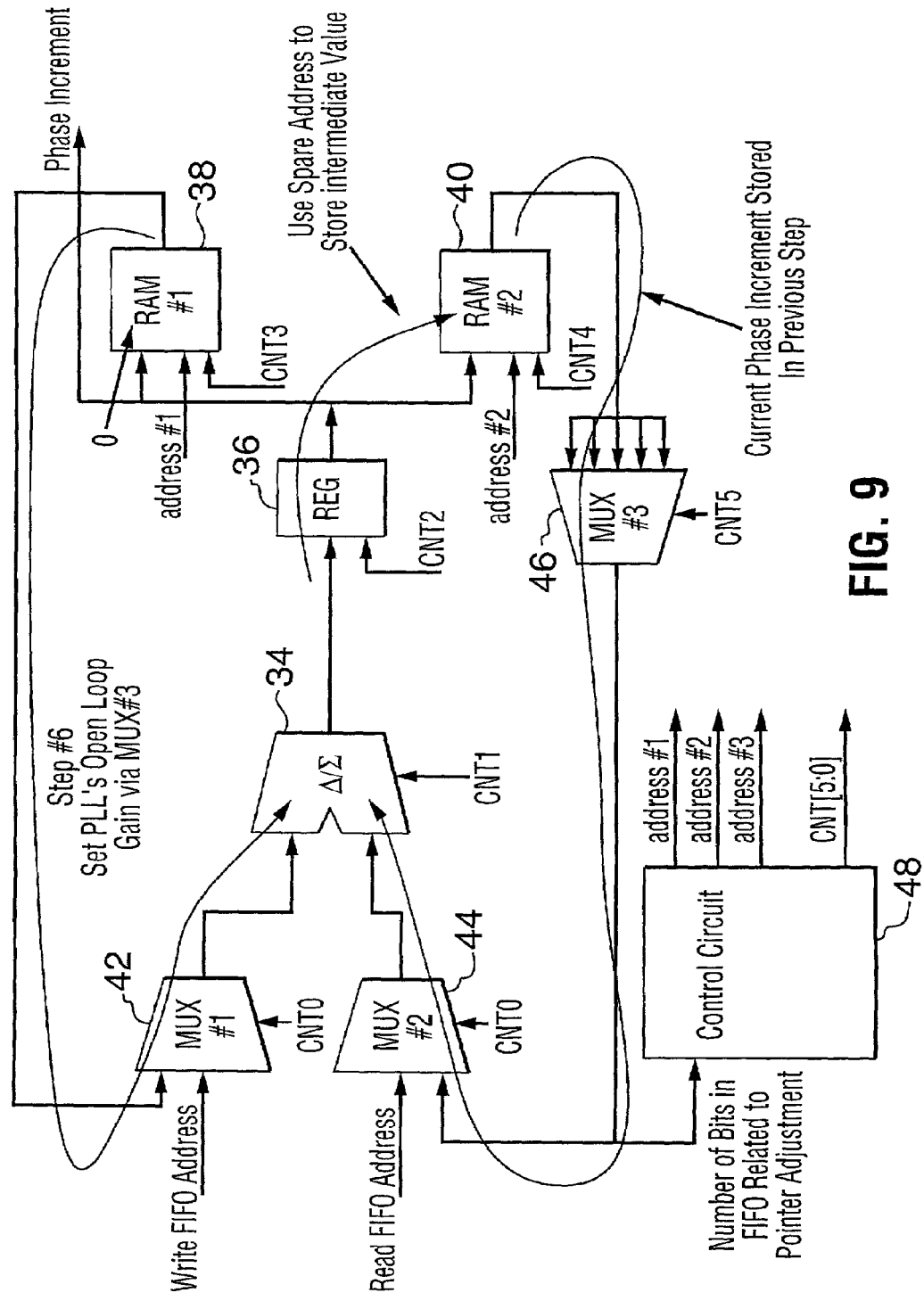

Scale the product of the previous operation. This can be again done by using a portion of bits that form the value after the filtering action. This operation sets the Open Loop Gain of the PLL, and therefore the bandwidth of the PLL. The used topology allows for some useful features. Because the actual FIFO address difference is calculated in the first step, the Open Loop Gain can be modified to prevent the FIFO spill. An adaptive gain with hysteresis is possible because the current gain value can be stored in small latch in the control circuit 48 and we can set the break-points for gain changes depending on address difference as well as current value of the gain. If the FIFO address difference is approaching its limits than the gain can be increased to prevent a slip. This is shown in FIG. 9. The result of this process is a PLL phase increment value.

Figure 10:
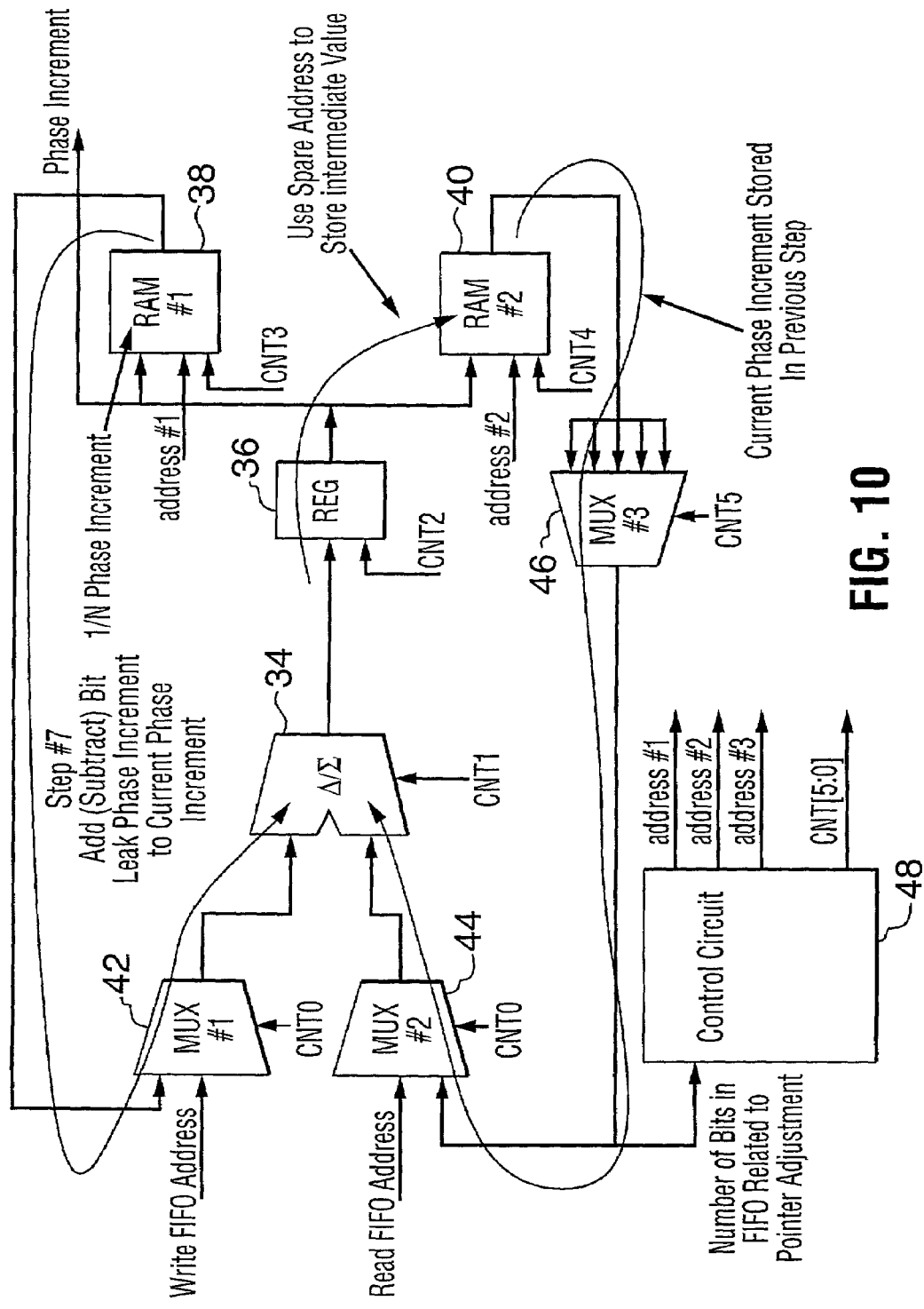

The next step implements the semi-open loop handling of the bits in FIFO 12 due to pointer adjustments. A small number is added/subtracted to the PLL phase increment value. This small number is stored in RAM #1 38 when the RAM is initialized, and it provides an extra phase modulation of the output clock designed so it will leak the bits stored in FIFO 12 related to the pointer adjustment. The value of the external phase modulation can be changed. The best performance is achieved if the value is gradually increased so as to prevent discontinuities in the phase function as well as the first derivative of the phase function (frequency). In this way, the bandwidth of the jitter is reduced. This is shown in FIG. 10.

Figure 11:
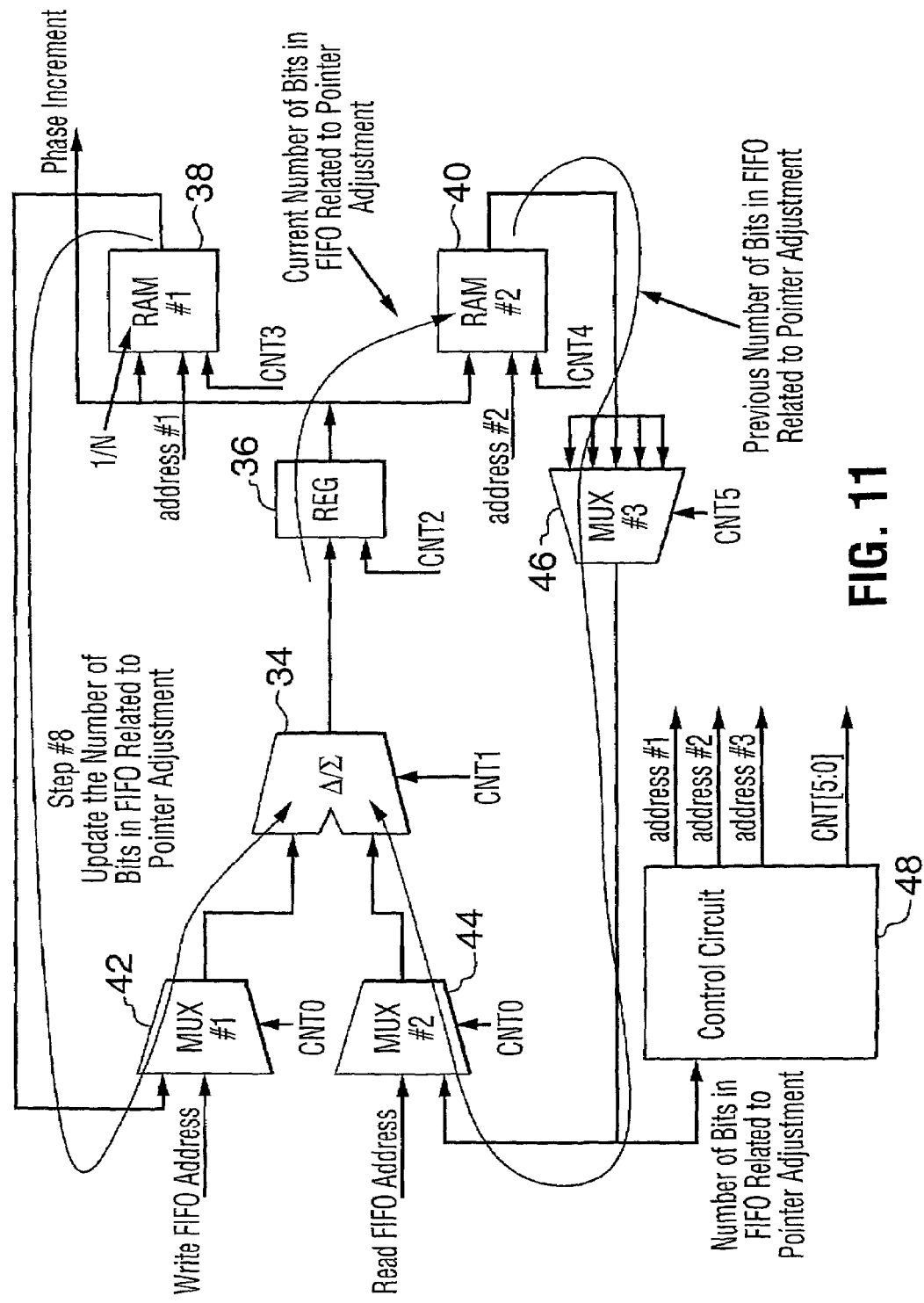

The last step is to update the number of bits in FIFO 12 due to the pointer adjustment stored in RAM #2 40 by adding/subtracting the amount of external phase increment used to extra modulate the endless phase modulator block 24. Alternatively, this external phase increment value is converted to UI (user interval). This is shown in FIG. 11.

FIGS. 4 to 11 show the performance of the steps of a preferred embodiment. The structure is flexible so with a minimum change in control signals, a different algorithm than that shown can be used.

Figure 12:
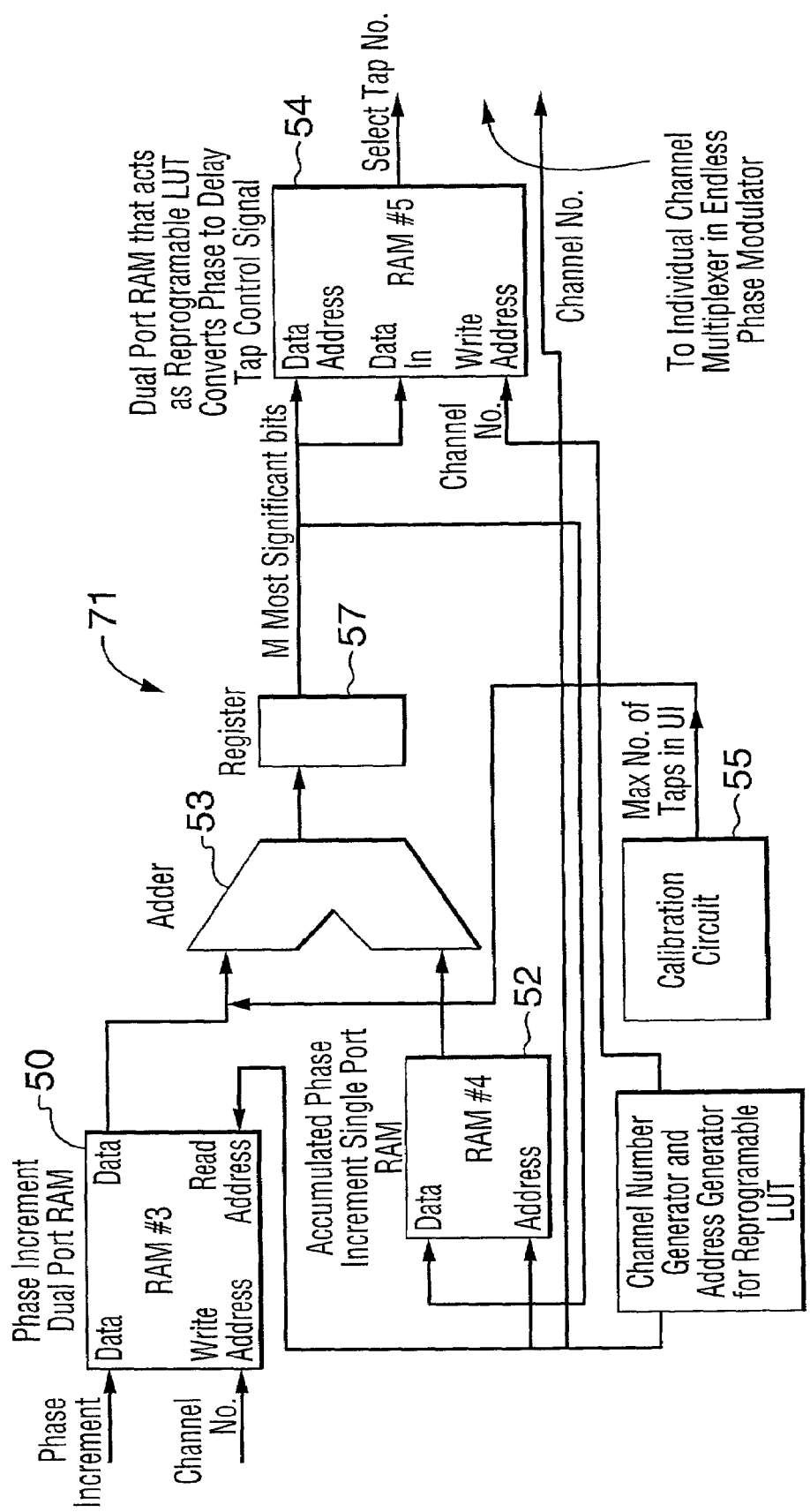
FIG. 12 is an endless phase modulator common control block.

After the total phase increment is obtained for an individual channel its value is written to the endless phase modulator block 24. The endless phase modulator common control block 71 is shown in FIG. 12. The RAM #3 50 in FIG. 12 is used to store the total phase increment. Inside the endless phase modulator block 24 the total phase increment value is added to the current phase contained in RAM #4 52. This operation could have been performed in the arithmetic unit block 18, but it is better to perform it in the endless phase modulator block 24, because, by doing so, intrinsic jitter is improved. The current phase value is used to control the output of the endless phase modulator 24. The current phase value is used as an address for a Look-Up Table (LUT) in RAM #5 54. The LUT output yields the setting for the multiplexer circuit select signal. The LUT is built using a dual port RAM. The LUT values contain the select values for the multiplexer circuits 56 in the endless modulator delay line circuit 51 (FIG. 13), and these values change with process variations, because the unit delay will change perhaps even +/−50% from a nominal value depending on process variation. If the current phase word is 8 bits wide one would need a LUT that is 8 times the number of all possible numbers of delay taps that are equal to one clock cycle. This would require a large LUT so it is better to use a RAM as an LUT.

The content of the LUT is generated and changed on the fly, depending also on the temperature variations. This is achieved using a calibration circuit 55 shown in FIG. 14. The calibration circuit 55 determines the number of taps that form a delay closest to one period of the crystal oscillator 26. Once this number is known, it is easy to determine the content of the LUT arithmetically. For example, if there are 73 taps that constitute the delay of one clock cycle and 8 bits represent a phase word, then the content of the LUT at address 73 should be an increment of 73/256. For the purpose of adding the number representing the increment 73/256, the adder circuit 53 in the endless phase modulator common control block 24 is used. For example, if a circuit is desynchronizing 12 DS3 channels dropped from the OC-3 SONET signal, the adder 53 can perform adding of the phase for each of the channels in round robin fashion and, at the end of the cycle, it can update one address of the LUT. After 256 round robin cycles, the whole LUT will be updated. The time interval for these 256 cycles is a fraction of a second, a much smaller time constant than the time constant of the temperature variation process. The LUT contains in its address space the incremental setting of the endless phase modulator circuit select signal per one bit increment of the phase value.

The endless phase modulator block 24 consists of a number of delay lines built using buffers. The total length of delay should be longer than one clock cycle even for the worst case of the process variation and the temperature change. A calibration circuit 55 should be used to determine the number of delay taps that is closest to the clock interval. The calibration circuit 55 is operating all the time to adjust to changes in temperature. Assume that there is N delay taps that give a delay of almost one clock period. Each tap is worth 360/N degrees. The phase value is converted to tap number. The phase value is compared to the multiples of tap value to determine which tap should be activated. The proposed structure allows the use of only one calibration circuit 55 and one delay line. The buffers each have the same delay and track each other as far as process variation as well as temperature. Therefore, one can use one delay line to generate all clocks. Only the multiplex circuits are required to be individual circuits for each channel.

When desynchronizing low data rate signals, like DS1 and E1, it may be more efficient to use the dual modulus divider for large phase steps and the short delay line to generate small phase steps. For the high data rates, like DS3 and E3, the whole delay line can be made out of buffers. Because the delay depends on temperature, the delay line needs to be constantly calibrated. Note that in this implementation of the endless phase modulator block 24 the loop bandwidth does not depend on the number of delay elements in one clock period. Only the intrinsic jitter depends on the number of delay elements in one clock cycle. The intrinsic jitter, when measured with a 10 Hz high pass filter, also depends on the frequency offset between the original clock and the synthesized clock using the endless phase modulator block 24.

Figure 14:
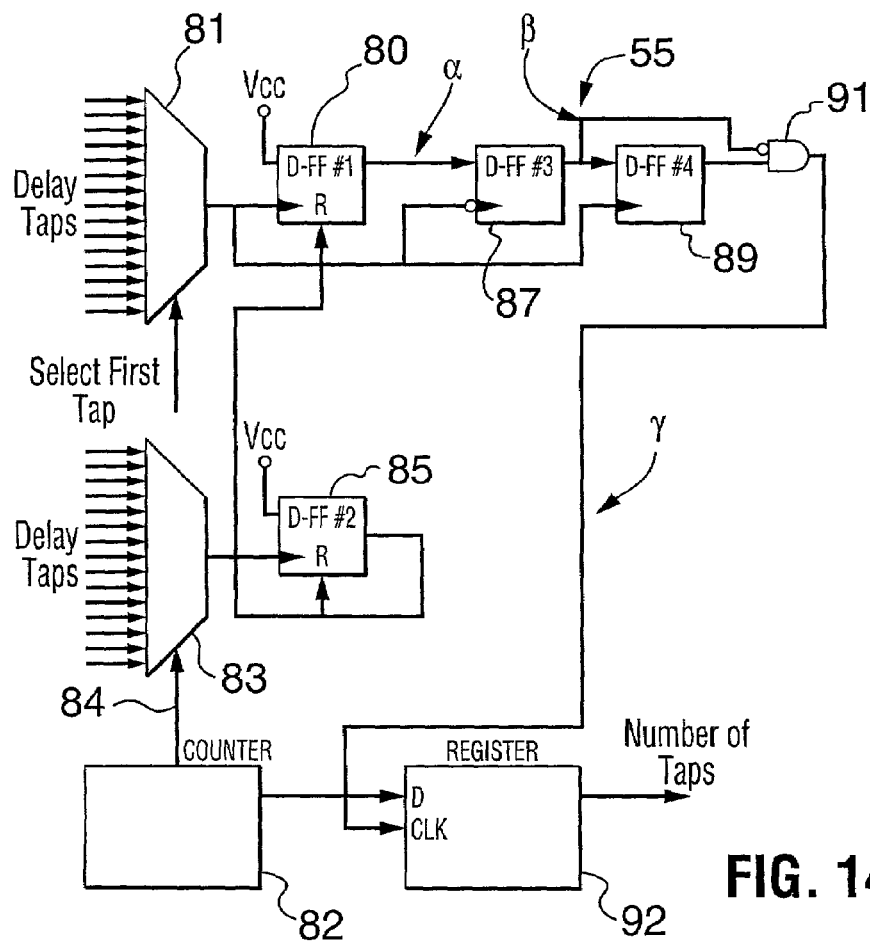
FIG. 14 is a delay line calibration circuit.

In the calibration circuit 55, shown in FIG. 14, multiplexer 81 receives as inputs the outputs from each of the delay taps and selects the first tap to be outputted to flip flop 80. Multiplexer 83 receives the outputs from each tap and outputs to flip flop 85 in accordance with the counter value from counter 82 on line 84 coupled to the select input of multiplexer 83. With the rising edge of the clock from the first tap selected from multiplexer 81, the output of flip flop 80 goes high. The rising edge of the delayed clock selected by multiplexer 83 by the count of counter 82 on line 84 causes flip flop 85 to issue a positive output which resets flip flop 80 and causes its output to go low. Once a clock from the Nth tap number is selected, whose delay exceeds the time at which the first tap clock falls back to a low, α remains high until the clock signal from the Nth tap falls to zero. However, β remains high disabling AND circuit 91 until the tap number is increased so that a delay is larger than a whole cycle. At such a point, β falls to zero and the transition is detected by flip flop 89, and AND circuit 91 which operate as a negative edge detector. The edge detection signal γ clocks in the count in counter 82 to register 92 and latches the latter.

Figure 16:
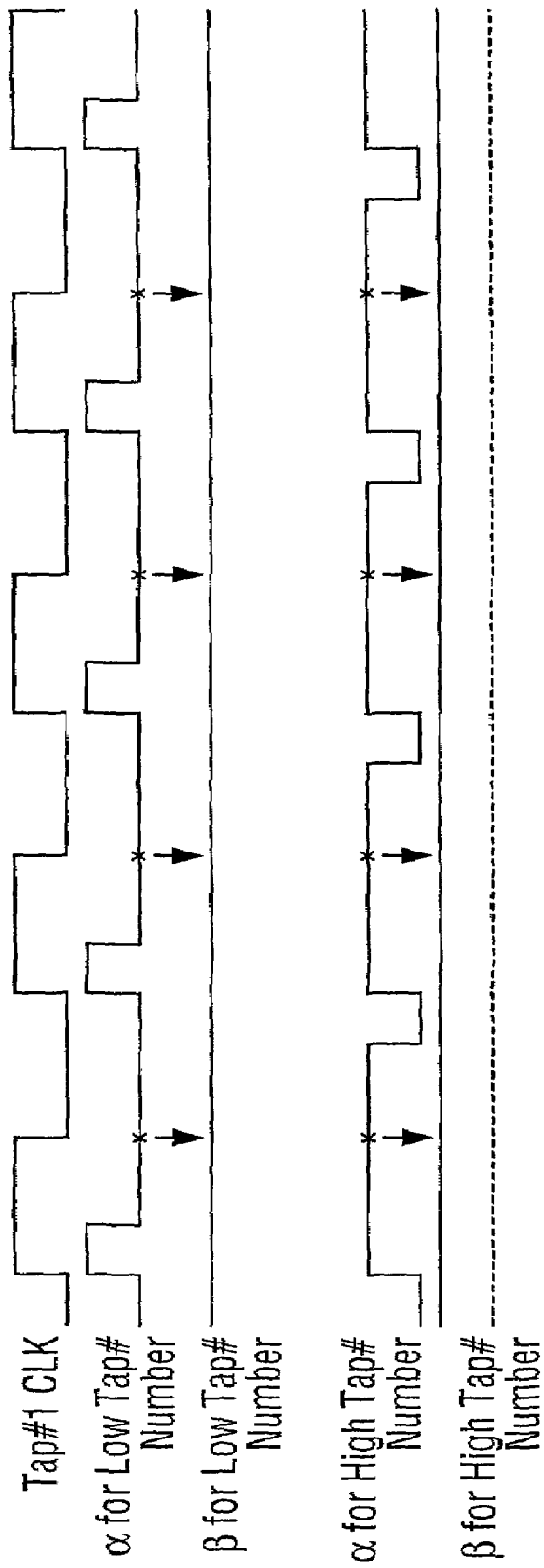
FIG. 16 is a waveform diagram of the calibration circuit for both a low and a high tap number.

Referring to FIG. 16, the waveform for the clock from the first tap number is shown at the top. The waveform for α shows it rising to "one" at the rising edge of the delayed clock of the first tap number and staying there until the rising edge of the Nth tap number delayed clock. In this case β remains low. The bottom three waveforms show α for a high tap number in which the rising edge of the Nth tap number delayed clock occurs after the fall of the first tap number delayed clock. In this case α remains at one and only resets when the rising edge of the Nth tap number clock. In this case β stays at one. Once the tap number is increased so that a delay is larger than a whole cycle, signal β is changed from high to low and the transition signal γ causes the current tap number to be latched in the register 92.

The latched tap number in register 92 is used to create a corrected frequency of operation. For example, assume that the tap number 16 produces a delay that is longer than one cycle. The latched signal that is given to register 92 by counter 82 is one less than 16, or 15 as the counter is started from the second tap. The number 15 is accumulated 255 times in the adder 53 (see FIG. 12), the register 57 and RAM #4 52. The products of this accumulation are written to RAM #5 54 by changing the write addresses of RAM #5 54 from 0 to 255. To update the content of RAM #5 54, the output of register 57 is fed to the data input of RAM #5 54. The numbers written into the data input of RAM #5 54 starting from address 0 to address 255 are as follows:

0, 15, 30, 60, . . . , 3795, 3810, 3825

If the eight least significant bits from register 57 are ignored so that only the "M" most significant bits are transferred to the Data input of RAM #5 54, the output Select Tap No. will take on the following values:

0, 0, 0, 0, . . . , 1, 1, 1, . . . , 2, 2, 2, . . . , 15, 15, 15, 15

Figure 17:
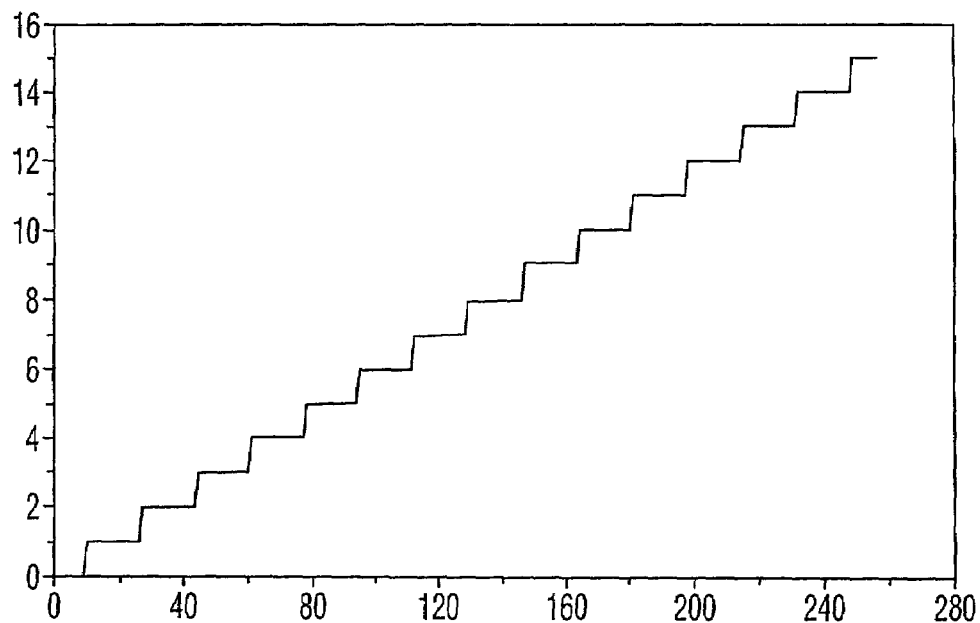
FIG. 17 is a graph of the selected tap number versus address for the case the latched tap number is 15.
Figure 18:
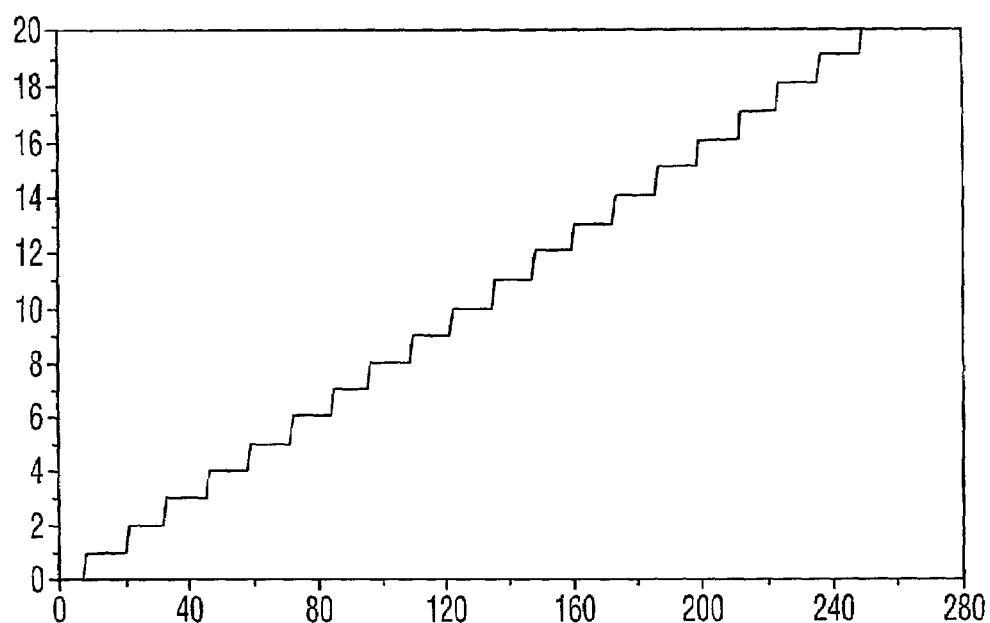
FIG. 18 is a graph of the selected tap number versus address for the case where the latched tap number is 20.

When the foregoing values of Select Tap No. versus corresponding data value are plotted one gets the staircase curve shown in FIG. 17. For comparison, the plot for a tap number of 20 is shown in FIG. 18. Thus, as all of the addresses in RAM #5 54 are cycled through from 0 to 255, one gets progressively increasing Select Tap Nos. from the output of RAM #5 54 which are applied to the gates of the multiplexers 56 to select the corresponding delayed clock line. With crystal oscillator 26 running at approximately 44.736 MHz for DS3 desynchronization, and using a frequency of 72 kHz for the updating the selection of delay taps, there will be only 14 to 15 updates of the phase per cycle of a frequency offset of 5 kHz. Physically, at each successively larger tap selection the delayed clock originating from the crystal oscillator 26 will be delayed $\frac{1}{14}$ per one clock cycle. With the addresses in RAM #5 54 progressively increasing from 0 to 255 in about 14 microseconds, one less cycle of the output clock is produced in this time. The foregoing adjustments are repeated for a new value latched by the calibration circuit. If the addresses of RAM #5 54 were progressively decreasing over this time, this would cause the output clock to advance one whole cycle so as to produce a higher output frequency.

The reason for adding the total phase increment in endless phase modulator block 24, and not in the arithmetic unit block 18, is due to the fact that this block has a smaller number of steps and can perform the function of adding the total phase increment to phase at a much higher rate than 72 kHz, as it might be done in the arithmetic unit block 18. A shorter interval between the updates of delay taps selection will result in smaller jitter. For example, in the case of DS3 desynchronization, if one needs to synthesize frequency offset of 5 kHz from the 44.736 MHz frequency of the crystal oscillator 26, using a 72 kHz update, one can have only 14 to 15 updates of the phase per one output clock cycle. This will result in phase steps of approximately $\frac{1}{14}$ UI. If the phase is updated at a higher rate, for example at 500 kHz, the number of delay tap updates per one clock cycle is at least 100 and the phase step will be $\frac{1}{100}$ UI. Because the selected delay taps will be closer to each other, glitching will be eliminated. When desynchronizing low data rate signals, like DS1 and E1, it may be more efficient to use the dual modulus divider for large phase steps and the short delay line to generate small phase steps. For the high data rates, like DS3 and E3, the whole delay line can be made out of buffers. Because the delay depends on temperature, the delay line needs to be constantly calibrated. Note that in the present implementation of the endless phase modulator block 24, the loop bandwidth does not depend on the number of delay elements in one clock period. Only the intrinsic jitter depends on the number of delay elements in one clock cycle. The intrinsic jitter, when measured with a 10 Hz high pass filter, also depends on the frequency offset between the original clock and the synthesized clock using the endless phase modulator block 24.

Figure 15:
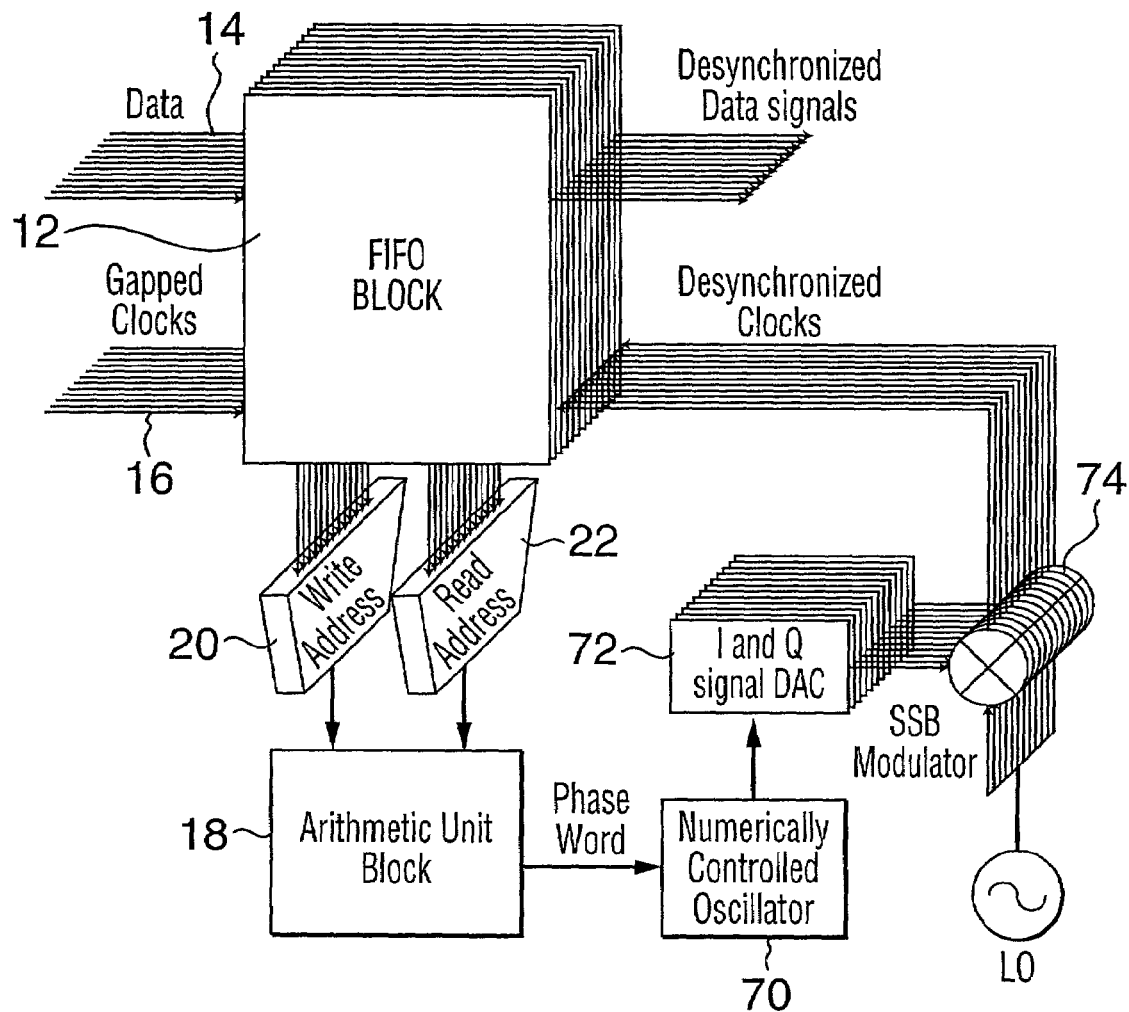
FIG. 15 is an alternative embodiment of the desynchronizer using a single side-band modulator (SSB)

The alternative embodiment of FIG. 15 shows a pointer adjustment signal that can be derived in a de-mapper so a pointer adjustment block may not be required. It also shows the system consisting of a numerically controlled oscillator (NCO) block 70, an I and Q DAC 72 and a single side-band modulator (SSB) 74 that can be used to effectively create the high frequency digitally controlled oscillator. The NCO block 70 looks exactly like the endless phase modulator block 24 except the RAM based LUT can be replaced by a sinusoidal ROM (not shown). The calculated phase is used as an address to the sinusoidal ROM to convert phase to amplitude. Only one quarter of the sinusoid needs to be stored, by inverting amplitude or address, the other three quarters of the sinusoid can be created. In the NCO block 70 the sine and cosine amplitude digital values are than converted to analog values with the use of a couple of one bit fractional digital to Analog Converter (DAC) circuits (not shown). These I and Q signals are then up-converted to the proper frequency with use of the SSB modulator 74.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A desynchronizer for desynchronizing a plurality of data channels of SONET/SDH data signals, comprising:
   (a) a plurality of first in first out buffer (FIFO) blocks, one for each of said data channels, said FIFO blocks each having respective FIFO read and write address outputs, a gapped clock input operative in response to gapped clock signals, to store input data extracted from a SONET/SDH frame;
   (b) an arithmetic unit having a phase word output and inputs coupled to the read and write address outputs of each of said FIFO blocks, operative to calculate an address difference of the read and write addresses for each of said FIFO blocks and a phase locked loop (PLL) phase increment value, which depends on the address difference and a pointer adjustment phase difference and adding or subtracting a small number to provide a total phase increment from said phase word output for each of said FIFO blocks;
   (c) an endless phase modulator common control block coupled to an output of said arithmetic unit operative to produce delay tap selection signals in response to corresponding total phase increment from said arithmetic unit;
   (d) an oscillator; and
   (e) an endless phase modulator coupled to an output of said endless phase modulator common control block and to said oscillator and operative in response to said delay tap selection signals to generate clock signals frequency shifted from a frequency of said oscillator and to apply said clock signals to respective desynchronized clock inputs of said FIFO buffer blocks and to thereby clock out desynchronized data signals from said FIFO buffer blocks.

2. The desynchronizer according to claim 1, wherein said endless phase modulator includes a delay line having delay elements with taps at junctions of said delay elements and a plurality of modulator multiplexers, one for each of said plurality of data channels, coupled to said taps and operative to select a delay tap selection signal in response to receipt of a tap select signal.

3. The desynchronizer according to claim 2, wherein the delay elements are buffers.

4. The desychronizer according to claim 2, wherein each of said delay tap selection signals is provided with a plurality of independent outputs, one corresponding to each of said data channels, with outputs of said taps coupled to inputs of corresponding ones of said modulator multiplexers.

5. The desynchronizer according to claim 2, including a calibration circuit having a pair of calibration multiplexers whose inputs are coupled to said delay tap selection signals and are operative to output a selected delay tap selection signal in response to a select tap number signal from said endless phase modulator.

6. The desynchronizer according to claim 5, wherein said calibration circuit has logic circuitry which latches a tap selection signal corresponding to a tap whose delay is one less than a tap number whose corresponding delay is the first of an increasing sequence of tap numbers to exceed one clock cycle.

7. The desynchronizer according to claim 6, wherein said arithmetic unit calculates the total phase increment for each of the channels in round robin fashion.

8. The desynchronizer according to claim 5, wherein said calibration circuit includes a counter to provide tap selection signals to said calibration multiplexers and logic circuitry which causes latching of a tap number from said counter in response to a clock signal generated by said logic circuitry.

9. The desynchronizer according to claim 1, wherein said arithmetic unit includes a write multiplexer and a read multiplexer having inputs coupled to respective write and read address outputs of said FIFO blocks and an add-subtract circuit having a first input coupled to an output of said write multiplexer and a second input coupled to an output of said read multiplexer, a register that latches an output of said add-subtract circuit and RAM storage for storing information used in calculating a phase increment for each channel.

10. The desynchronizer according to claim 9, wherein said RAM storage includes two RAM blocks with an output of a first of said two RAM blocks coupled to an input of said write multiplexer and an output of a second of said two RAM blocks coupled through a third multiplexer to an input of said read multiplexer and an input of a control circuit and wherein said control circuit controls operation of said two RAM blocks, said read and write multiplexer, said register, said third multiplexer and said add-subtract circuit.

11. The desynchronizer according to claim 10, wherein said third multiplexer scales an accumulated FIFO address difference.

12. The desynchronizer according to claim 2, wherein tap signals applied to inputs of each modulator multiplexer are selected on a round robin basis.

13. The desynchronizer according to claim 2, including a reprogrammable Look-up-Table (LUT) in said endless phase modulator control block operative to convert phase to a tap selection signal for application to said modulator multiplexers.

14. The desynchronizer according to claim 1, wherein said arithmetic unit has a read FIFO address arithmetic multiplexer and a write FIFO address arithmetic multiplexer for receiving and storing FIFO read and write addresses from said FIFO read and write address outputs, an add-subtract circuit coupled to said arithmetic multiplexers operative to add or subtract outputs from said arithmetic multiplexers, a register coupled to an output of said add-subtract circuit, a pair of memory blocks coupled to an output of said register, a current memory block for storing a current FIFO and an accumulated memory block for storing an accumulated FIFO address difference, a feedback multiplexer circuit coupled between said accumulated memory block and an input to said read FIFO address arithmetic multiplexer, and a control circuit coupled to an output of said feedback multiplexer and an operative to control operation of said arithmetic unit.

15. A method of desynchronizing a plurality of data channels of SONET/SDH data signals, comprising:
   (a) receiving data from a SONET/SDH channel in a first-in-first-out buffer (FIFO) using a gapped clock corresponding to data in which overhead has been removed;
   (b) calculating a difference between a write address of said FIFO and a read address thereof and storing the difference in a first memory block;
   (c) adding or subtracting a pointer adjustment for a given channel from the difference in step (b);
   (d) calculating a phase locked loop increment value from the difference;
   (e) providing extra phase modulation of an output clock so as to leak bits stored in said FIFO related to the pointer adjustment and reduce bandwidth of jitter;
   (f) adding or subtracting the amount of external phase increment used to extra modulate an endless phase modulator;
   (g) generating a tap selection number from said phase increment and applying said tap selection number to a multiplexer of an endless phase modulator to gate a selected tap signal through said endless phase modulator multiplexer;
   (h) applying the selected tap signal to a calibration circuit to latch a tap number, M, that is one less than a tap number that corresponds to a delay of one clock cycle;
   (i) accumulating the latched tap number 2N times in an arithmetic unit, where N is an integer, and storing numbers 2N×M in address locations of a memory block corresponding to each accumulation; and
   (j) applying in succession tap select signals increasing from a first tap up to an Mth tap to channel multiplexer selection inputs so as to reduce the frequency of clock signals passing through a channel multiplexer.

16. A desynchronizer for desynchronizing a plurality of data channels of SONET/SDH data signals, comprising:
   (a) a plurality of first in first out buffer (FIFO) blocks, one for each of said data channels, said FIFO blocks each having respective FIFO read and write address outputs, a gapped clock input operative in response to gapped clock signals, to store input data extracted from a SONET/SDH frame;
   (b) an arithmetic unit having a phase word output and inputs coupled to the read and write address outputs of each of said FIFO blocks, operative to calculate an address difference of the read and write addresses for each of said FIFO blocks and a phase locked loop (PLL) phase increment value, which depends on the address difference, adding or subtracting a small number to provide a total phase increment from said phase word output;
   (c) a numerically controlled oscillator coupled to an output of said arithmetic unit operative to produce a digital oscillator output;
   (d) an I and Q signal digital-to-analog converter coupled to the output of said numerically controlled oscillator and having an analog output;
   (e) a crystal oscillator; and
   (f) a single side band modulator coupled to an output of said crystal oscillator and to said analog output, operative to produce desynchronized clocks coupled to respective FIFO channel blocks for clocking desynchronized data signals from said FIFOs.

17. A method of desynchronizing data signals on a plurality of channels of SONET/SDH signals, comprising:
   (a) storing data, extracted from SONET/SDH frames on said plurality of channels, in a FIFO block using a gapped clock;
   (b) calculating an address difference between write and read addresses of said FIFO block and a phase locked loop total phase increment value which depends on said address difference;
   (c) producing a delay tap control signal for each channel from said total phase increment value for selecting a delay of an oscillator signal from an oscillator for said each channel; and
   (d) producing desynchronized clock signals from said delayed oscillator signals and applying said clock signals to clock out desynchronized data from said FIFO.

* * * * *

UNITED STATES PATENT AND TRADEMARK OFFICE
CERTIFICATE OF CORRECTION

PATENT NO. : 6,982,995 B2  
DATED : January 3, 2006  
INVENTOR(S) : Predrag Sava Acimovic Page 1 of 1

It is certified that error appears in the above-identified patent and that said Letters Patent is hereby corrected as shown below:

Column 10,  
Line 16, replace "0,0,0,0,..., 1,1,1,..., 2,2,2,..., 15,15,15,15"  
with -- 0,0,0,0,...., 1,1,1,...., 2,2,2,...., 15,15,15,15 --.

Column 11,  
Line 47, after "write" delete "address".

Column 14,  
Line 9, delete "from" and replace with -- form --.

Signed and Sealed this

Sixth Day of June, 2006

JON W. DUDAS  
*Director of the United States Patent and Trademark Office*